United States Patent
Lee

(10) Patent No.: US 10,535,405 B2
(45) Date of Patent: Jan. 14, 2020

(54) MEMORY DEVICE HAVING COMMON SOURCE LINES COUPLED TO MEMORY BLOCKS RESPECTIVELY AND OPERATING METHOD THEREOF

(71) Applicant: SK hynix Inc., Icheon-si, Gyeonggi-do (KR)

(72) Inventor: Nam Jae Lee, Cheongju-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/850,357

(22) Filed: Dec. 21, 2017

(65) Prior Publication Data

US 2019/0019558 A1    Jan. 17, 2019

(30) Foreign Application Priority Data

Jul. 14, 2017  (KR) .................. 10-2017-0089602

(51) Int. Cl.

| | | |
|---|---|---|
| *G11C 16/08* | (2006.01) | |
| *G11C 16/04* | (2006.01) | |
| *G11C 16/10* | (2006.01) | |
| *G11C 16/26* | (2006.01) | |
| *G11C 16/30* | (2006.01) | |
| *H01L 27/1157* | (2017.01) | |
| *G11C 16/16* | (2006.01) | |
| *H01L 27/11575* | (2017.01) | |
| *H01L 27/11565* | (2017.01) | |
| *H01L 27/11582* | (2017.01) | |

(Continued)

(52) U.S. Cl.
CPC .............. *G11C 16/08* (2013.01); *G11C 16/16* (2013.01); *G11C 16/30* (2013.01); *H01L 27/1157* (2013.01); *H01L 27/11565* (2013.01); *H01L 27/11575* (2013.01); *G11C 16/0483* (2013.01); *G11C 16/10* (2013.01); *G11C 16/26* (2013.01); *H01L 27/11524* (2013.01); *H01L 27/11556* (2013.01); *H01L 27/11582* (2013.01)

(58) Field of Classification Search
CPC ..... G11C 16/0483; G11C 16/24; G11C 16/26; G11C 16/10; G11C 16/08; G11C 11/5642; G11C 7/18; G11C 8/12
USPC ............ 365/185.17, 185.11, 185.22, 185.33, 365/185.13, 185.24, 185.25
See application file for complete search history.

(56) References Cited

U.S. PATENT DOCUMENTS

| 8,274,829 B2 * | 9/2012 | Lee .......................... G11C 8/12 365/185.02 |
| 9,558,835 B2 * | 1/2017 | Lee ........................ G11C 16/16 |

(Continued)

FOREIGN PATENT DOCUMENTS

| KR | 1020140020153 A | 2/2014 |
| KR | 1020140086599 A | 7/2014 |
| KR | 1020170099687 A | 9/2017 |

*Primary Examiner* — Gene N Auduong
(74) *Attorney, Agent, or Firm* — William Park & Associates Ltd.

(57) ABSTRACT

A memory device and an operating method thereof are provided. A memory device may include a plurality of source lines coupled to a memory block. The memory device may include a plurality of strings coupled to each of the source lines. The memory device may include a row decoder configured to selectively transmit voltages to local lines corresponding to a selected source line among the source lines.

17 Claims, 14 Drawing Sheets

(51) Int. Cl.
*H01L 27/11524* (2017.01)
*H01L 27/11556* (2017.01)

(56) References Cited

U.S. PATENT DOCUMENTS

| 2011/0267892 | A1* | 11/2011 | Kim | G11C 16/26 |
| | | | | 365/185.21 |
| 2013/0272067 | A1* | 10/2013 | Lee | G11C 16/10 |
| | | | | 365/185.11 |
| 2013/0279251 | A1* | 10/2013 | Lee | G11C 16/26 |
| | | | | 365/185.03 |
| 2014/0169096 | A1* | 6/2014 | Koo | G11C 16/24 |
| | | | | 365/185.17 |

* cited by examiner

FIG. 3
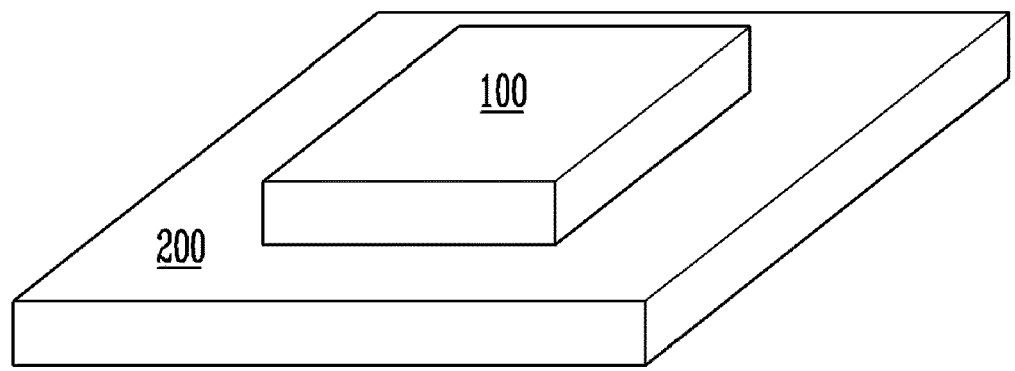
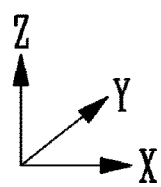
FIG. 4
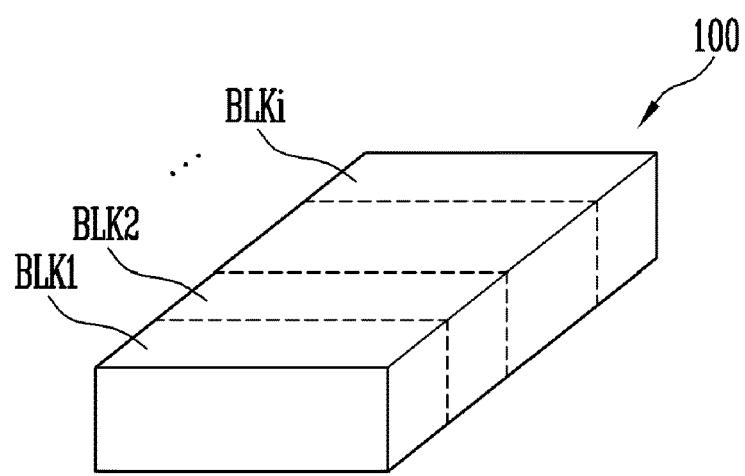
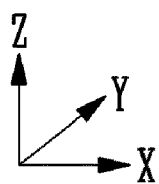

MEMORY DEVICE HAVING COMMON SOURCE LINES COUPLED TO MEMORY BLOCKS RESPECTIVELY AND OPERATING METHOD THEREOF

CROSS-REFERENCE TO RELATED APPLICATION

The present application claims priority under 35 U.S.C. § 119(a) to Korean patent application number 10-2017-0089602 filed on Jul. 14, 2017 in the Korean Intellectual Property Office, the entire disclosure of which is incorporated herein by reference.

BACKGROUND

1. Technical Field

An aspect of the present disclosure generally relates to a memory device and an operating method thereof, and more particularly, to a memory device including source lines and an operating method of the memory device.

2. Related Art

A memory system may include a memory device and a memory controller.

The memory device may store data or output the stored data. For example, the memory device may be configured as a volatile memory device in which stored data is extinguished when the power supply is interrupted, or be configured as a nonvolatile memory device in which stored data is retained when the power supply is interrupted. The memory controller may control data communication between a host and the memory device.

The host may communicate with the memory device through the memory controller by using an interface protocol such as peripheral component interconnect-express (PCI-E), advanced technology attachment (ATA), serial ATA (SATA), parallel ATA (PATA), or serial attached SCSI (SAS). Interface protocols between the host and the memory system are not limited to the above-described examples, and may include various interface protocols such as a universal serial bus (USB), a multi-media card (MMC), an enhanced small disk interface (ESDI), and integrated drive electronics (IDE).

SUMMARY

According to an aspect of the present disclosure, there is provided a memory device. The memory device may include a plurality of source lines coupled to a memory block. The memory device may include a plurality of strings coupled to each of the source lines. The memory device may include a source decoder configured to selectively apply voltages to the source lines. The memory device may include a row decoder configured to selectively transmit voltages to local lines corresponding to a selected source line among the source lines.

According to an aspect of the present disclosure, there is provided a memory device. The memory device may include a plurality of source lines. The memory device may include sub-memory blocks divided in units of the source lines. The memory device may include a memory block including the sub-memory blocks. The memory device may include global switch circuits configured to transmit operating voltages to sub-global lines. The memory device may include local switch circuits configured to selectively transmit the operating voltages applied to the sub-global lines to local lines of a selected sub-memory block among the sub-memory blocks. The memory device may include source switch circuits configured to selectively transmit a voltage to the source lines.

According to an aspect of the present disclosure, there is provided a method for operating a memory device in which a plurality of sub-memory blocks divided in units of a plurality of source lines are included in each of memory blocks, the method may include applying a voltage to a source line coupled to a selected sub-memory block among the sub-memory blocks. The method may include transmitting operating voltages to sub-global lines through a global switch circuit corresponding to the selected sub-memory block among a plurality of global switch circuits. The method may include transmitting the operating voltages applied to the sub-global lines to local lines coupled to the sub-memory block through a local switch circuit corresponding to the selected sub-memory block.

BRIEF DESCRIPTION OF THE DRAWINGS

FIG. 3 is a view illustrating a configuration of a memory cell array and peripheral circuits of FIG. 1.

FIG. 4 is a view illustrating the memory cell array of FIG. 1.

DETAILED DESCRIPTION

Figure 1:
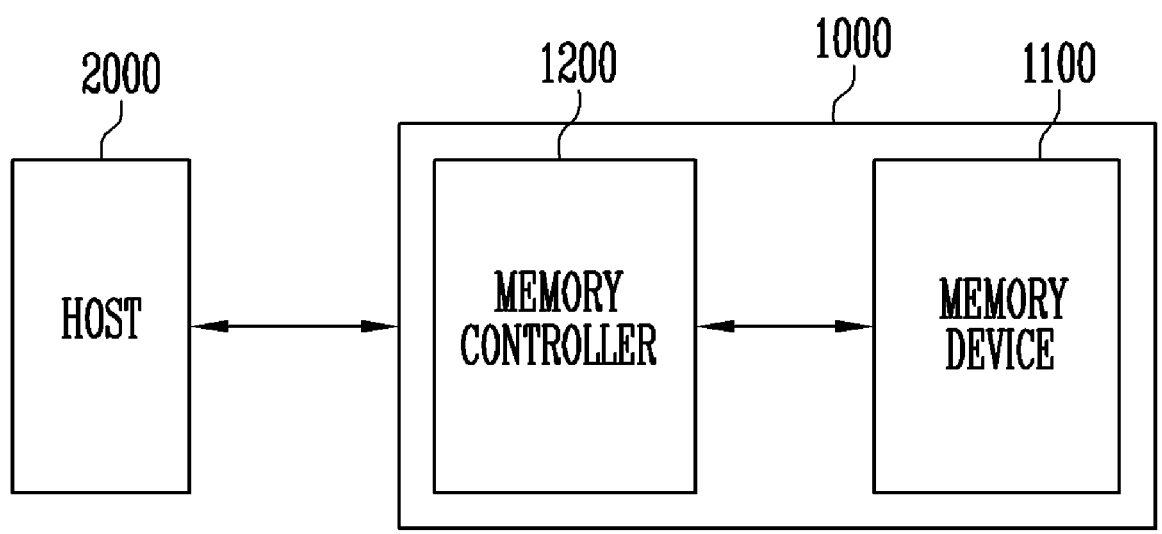
FIG. 1 is a diagram illustrating a memory system according to an embodiment of the present disclosure.

In the following detailed description, only certain examples of embodiments of the present disclosure have been illustrated and described. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Embodiments of the present disclosure may provide a memory device in which a plurality of source lines are coupled each memory block, and a row decoder capable of controlling the memory block to which the plurality of source lines are coupled in the memory device.

Example of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a diagram illustrating a memory system according to an embodiment of the present disclosure.

Referring to FIG. 1, the memory system 1000 may include a memory device 1100 that stores data and a memory controller 1200 that controls the memory device 1100 under the control of a host 2000.

The memory device 1100 may be configured to store data under the control of the memory controller 1200, output the stored data, or erase the stored data.

The host 2000 may communicate with the memory system 1000 by using an interface protocol such as peripheral component interconnect-express (PCI-E), advanced technology attachment (ATA), serial ATA (SATA), parallel ATA (PATA), or serial attached SCSI (SAS). In addition, interface protocols between the host 2000 and the memory system 1000 are not limited to the above-described examples, and may further include interface protocols such as a universal serial bus (USB), a multi-media card (MMC), an enhanced small disk interface (ESDI), and integrated drive electronics (IDE).

The memory controller 1200 may control overall operations of the memory system 1000, and control data exchange between the host 2000 and the memory device 1100. For example, the memory controller 1200 may convert received information such that commands, addresses, and data can be communicated between the host 2000 and the memory device 1100, and store and output the converted information. As described above, segments of various information may be stored in the memory controller 1200. Therefore, the memory controller 1200 may include a plurality of tables in which segments are stored. If segments are varied, a corresponding table may be updated. The memory controller 1200 may control the memory device 1100 by using the segments stored in the tables. For example, the memory controller 1200 may control the memory device 1100 to perform program, read, and erase operations.

The memory device 1100 may perform a program, read, or erase operation under the control of the memory controller 1200. Also, the memory device 1100 may receive segments from the memory controller 1200 and store the segments in a designated memory block. In some embodiments, the memory device 1100 may include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), and a flash memory.

Figure 2:
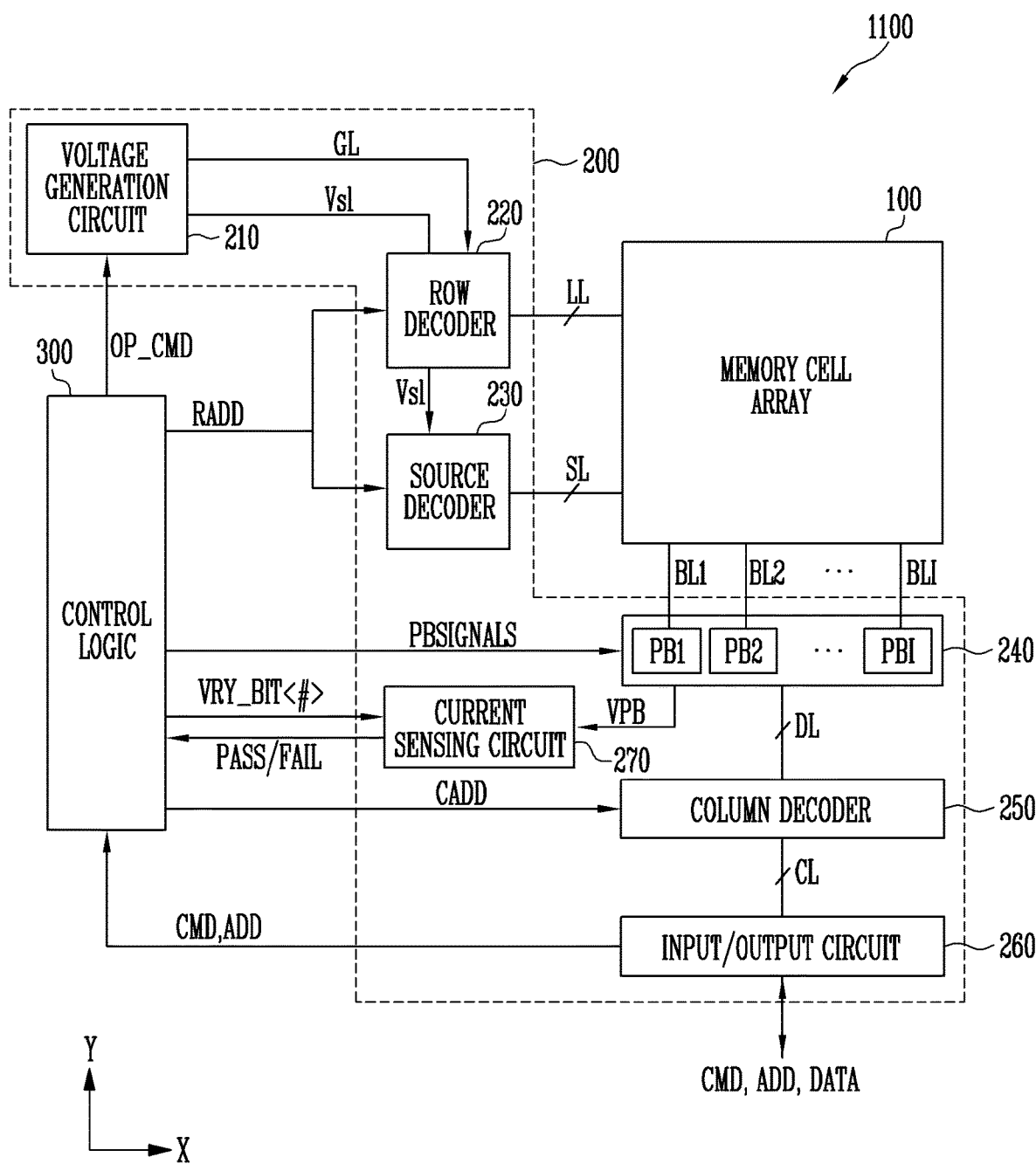
FIG. 2 is a diagram illustrating a memory device of FIG. 1.

FIG. 2 is a diagram illustrating the memory device of FIG. 1.

Referring to FIG. 2, the memory device 1110 may include a memory cell array 100 that store data. The memory device 1110 may include peripheral circuits 200 configured to perform a program operation for storing data in the memory cell array 100, a read operation for outputting the stored data, and an erase operation for erasing the stored data. The memory device 1110 may include a control logic 300 that controls the peripheral circuits 200 under the control of the memory controller (1200 of FIG. 1).

The memory cell array 100 may include a plurality of memory blocks. User data and various information necessary for an operation of the memory device 1100 may be stored in the memory blocks. The memory blocks may be implemented in a three-dimensional structure, and may include a plurality of sub-memory blocks. The memory blocks having the three-dimensional structure may be configured with a plurality of memory blocks including strings perpendicular to a substrate. The sub-memory blocks may be defined depending on source lines. For example, strings coupled to one source line may be defined as one sub-memory block.

The peripheral circuits 200 may be configured to perform program, read, and erase operations under the control of the control logic 300. For example, the peripheral circuits 200 may include a voltage generation circuit 210, a row decoder 220, a source decoder 230, a page buffer group 240, a column decoder 250, an input/output circuit 260, and a current sensing circuit 270.

The voltage generation circuit 210 may generate various operating voltages used for program, read, and erase operations in response to an operation signal OP_CMD. For example, the voltage generation circuit 210, under the control of the control logic 300, may generate a program voltage, a read voltage, an erase voltage, a verify voltage, a pass voltage, a turn-on voltage, and the like, and transmit the generated voltages to the row decoder 220 through global lines GL. Also, the voltage generation circuit 210 may generate source line voltages Vsl having various levels, which are to be applied to source lines SL, and transmit the generated source line voltages Vsl to the source decoder 230. The source line voltages Vsl may include an erase voltage, a non-erase voltage, a ground voltage, and the like.

The row decoder 220 may transmit operating voltages to local lines LL coupled to a selected memory block among the memory blocks of the memory cell array 100, in response to a row address RADD. The local lines LL may include local word lines, local drain select lines, and local source select lines. In addition, the local lines LL may include dummy word lines.

The source decoder 230 may transmit source line voltage Vsl to the source lines SL of the memory cell array 100, in response to the row address RADD. For example, in an erase operation, the source decoder 230 may transmit the erase voltage to source lines SL coupled to a selected memory block or selected sub-memory blocks, and transmit the non-erase voltage or the ground voltage to source lines SL coupled to the other unselected memory blocks or the other unselected sub-memory blocks or allow the source lines SL to be floated.

The page buffer group 240 may be coupled to bit lines BL1 to BLI coupled to the memory blocks of the memory cell array 100. The page buffer group 240 may include a plurality of page buffers PB1 to PBI coupled to the bit lines BL1 to BLI. The page buffers PB1 to PBI may operate in response to page buffer control signals PBSIGNALS. For example, the page buffers PB1 to PBI may arbitrarily store data received through the bit lines BL1 to BLI, or sense a voltage or current of the bit lines BL1 to BLI in a read or verify operation.

The column decoder 250 may transmit data between the input/output circuit 260 and the page buffer group 240 in response to a column address CADD. For example, the column decoder 250 may transmit/receive data to/from the page buffers PB through data lines DL, or transmit/receive data to/from the input/output circuit 260 through column lines CL.

The input/output circuit 260 may transmit a command CMD and an address ADD, which are received from the memory controller (1200 of FIG. 1), to the control logic 300, or transmit/receive data DATA to/from the column decoder 250.

The current sensing circuit 270, in a read or verify operation, may generate a reference current in response to a permission bit VRY_BIT<#>, and output a pass signal PASS or a fail signal FAIL by comparing a sensing voltage VPB received from the page buffer group 240 with a reference voltage generated by the reference current.

The control logic 300 may control the peripheral circuits 200 by outputting the operating signal OP_CMD, the row address RADD, the page buffer control signals PBSIGNALS, and the permission bit VRY_BIT<#> in response to the command CMD and the address ADD. Also, the control logic 300 may determine whether the verify operation has passed or failed in response to the pass signal PASS or the fail signal FAIL.

FIG. 3 is a view illustrating a configuration of the memory cell array and the peripheral circuits of FIG. 1.

Referring to FIG. 3, the memory cell array 100 may be disposed on the top of the peripheral circuits 200. Such a structure is also called as peripheral under cell (PUC). For example, the memory cell array 100 may be stacked in a Z direction from the peripheral circuits 200.

FIG. 4 is a view illustrating the memory cell array of FIG. 1.

Referring to FIG. 4, the memory cell array 100 may include a plurality of memory blocks BLK1 to BLKi. The memory blocks BLK1 to BLKi may be arranged in a Y direction horizontal to a substrate. When the memory blocks BLK1 to BLKi are arranged in the Y direction, bit lines may be arranged in an X direction perpendicular to the Y-direction, and memory cells included in one string may be arranged in a Z direction perpendicular to the substrate.

Figure 5:
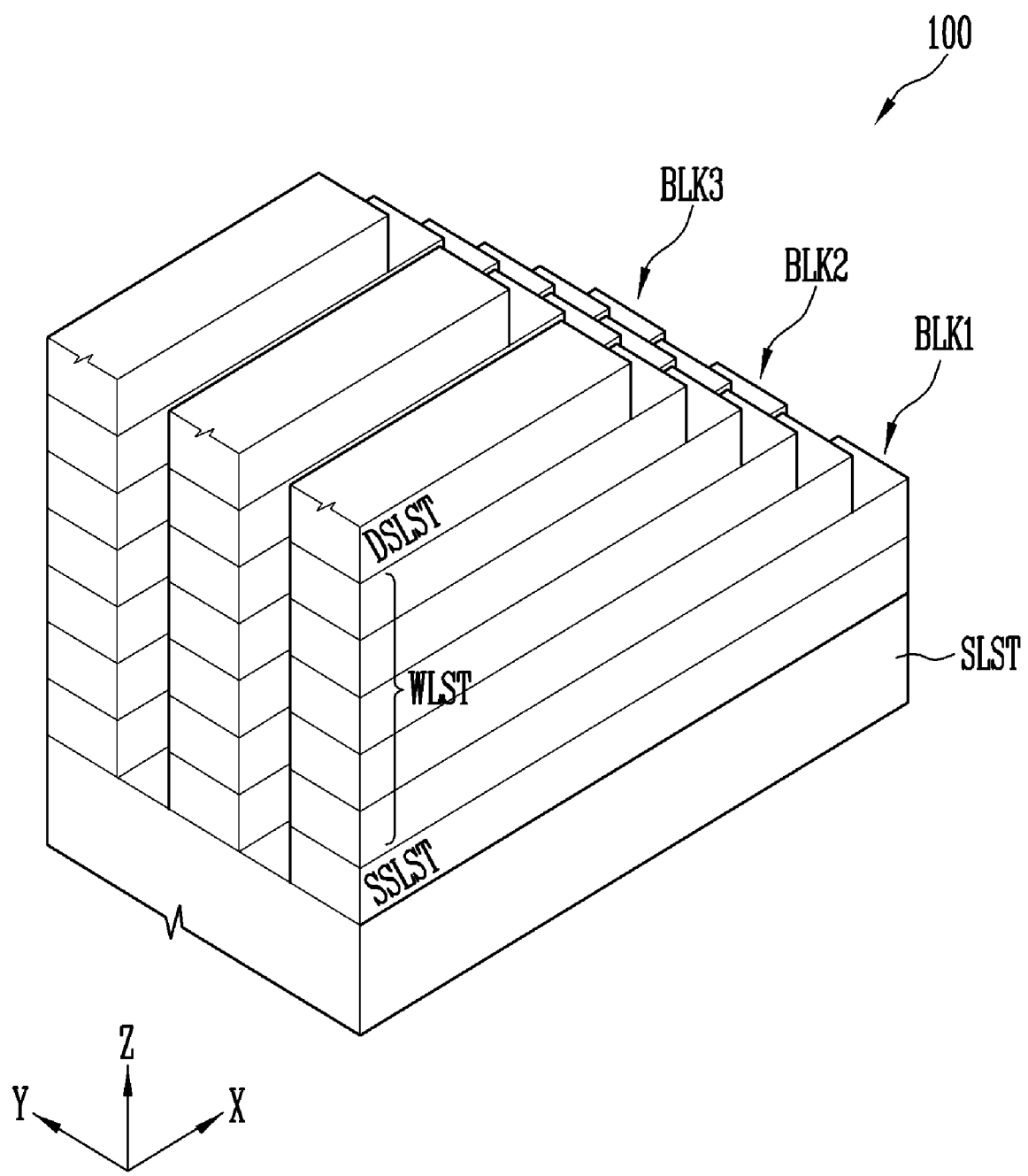
FIG. 5 is a perspective view illustrating a configuration of memory blocks.

FIG. 5 is a perspective view illustrating a configuration of memory blocks.

Referring to FIG. 5, the memory cell array 100 may include a plurality of memory blocks BLK1, BLK2, and BLK3 separated by slits. Although three memory blocks BLK1, BLK2, and BLK3 are illustrated in the drawing, the number of memory blocks is not limited thereto. Each of the memory blocks BLK1, BLK2, and BLK3 may extend along an X direction. Stack structures in an edge region of each of the memory blocks BLK1, BLK2, and BLK3 may form a step structure. Each of the memory blocks BLK1, BLK2, and BLK3 may include a source select stack structure SSLST, a word line stack structure WLST, and a drain select stack structure DSLST, which are stacked on the top of a source layer stack structure SLST.

Although not illustrated in FIG. 5, the source layer stack structure SLST may include a plurality of source lines. A plurality of source lines may be included in a source layer stack structure SLST corresponding to one memory block.

Figure 6:
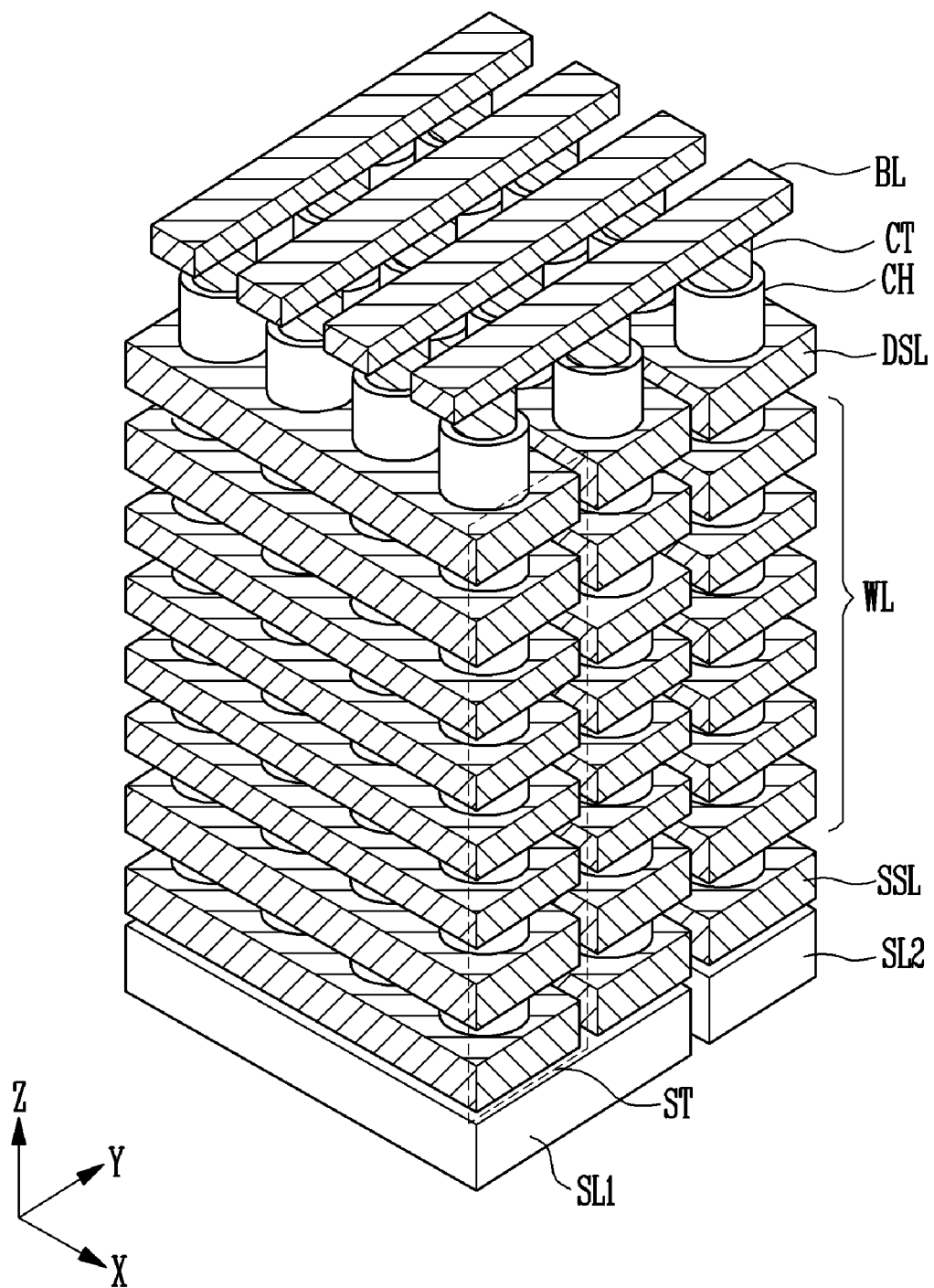
FIG. 6 is a perspective view illustrating an embodiment of a memory block.

FIG. 6 is a perspective view illustrating an embodiment of a memory block.

In this embodiment, a plurality of source lines are formed in one memory block.

Referring to FIG. 6, a portion of a memory block implemented in a three-dimensional structure is illustrated, and a structure in which a plurality of strings ST are formed on source lines SL1 and SL2 is disclosed. The strings ST may be formed in an I shape perpendicular in a Z direction to a substrate, and be arranged between bit lines BL and the source lines SL1 and SL2. This structure is also referred to as a bit cost scalable (BiCS) structure. For example, when the source lines SL1 and SL2 are horizontally formed on the substrate, the strings ST having the BiCS structure may be formed in the vertical direction on the source lines SL1 and SL2. For example, the strings ST may be arranged in X and Y directions on the source lines SL1 and SL2. The strings ST may include source select lines SSL, word lines WL, and drain select lines DSL, which are stacked on the source lines SL1 and SL2 to be spaced apart from each other. Numbers of source select lines SSL, word lines WL, and drain select lines DSL is not limited to those illustrated in the drawing, and may be changed depending on memory devices. The strings ST may include vertical channel layers CH that vertically penetrate the source select lines SSL, the word lines WL, and the drain select lines DSL. The bit lines BL may be in contact with the tops of the vertical channel layers CH extending upward from the drain select lines DSL, extend in the Y direction, and be arranged in the X direction to be spaced apart from each other. Memory cells may be formed between the word lines WL and the vertical channel layers CH. Contact plugs CT may be further formed between the bit lines BL and the vertical channel layers CH.

Figure 7:
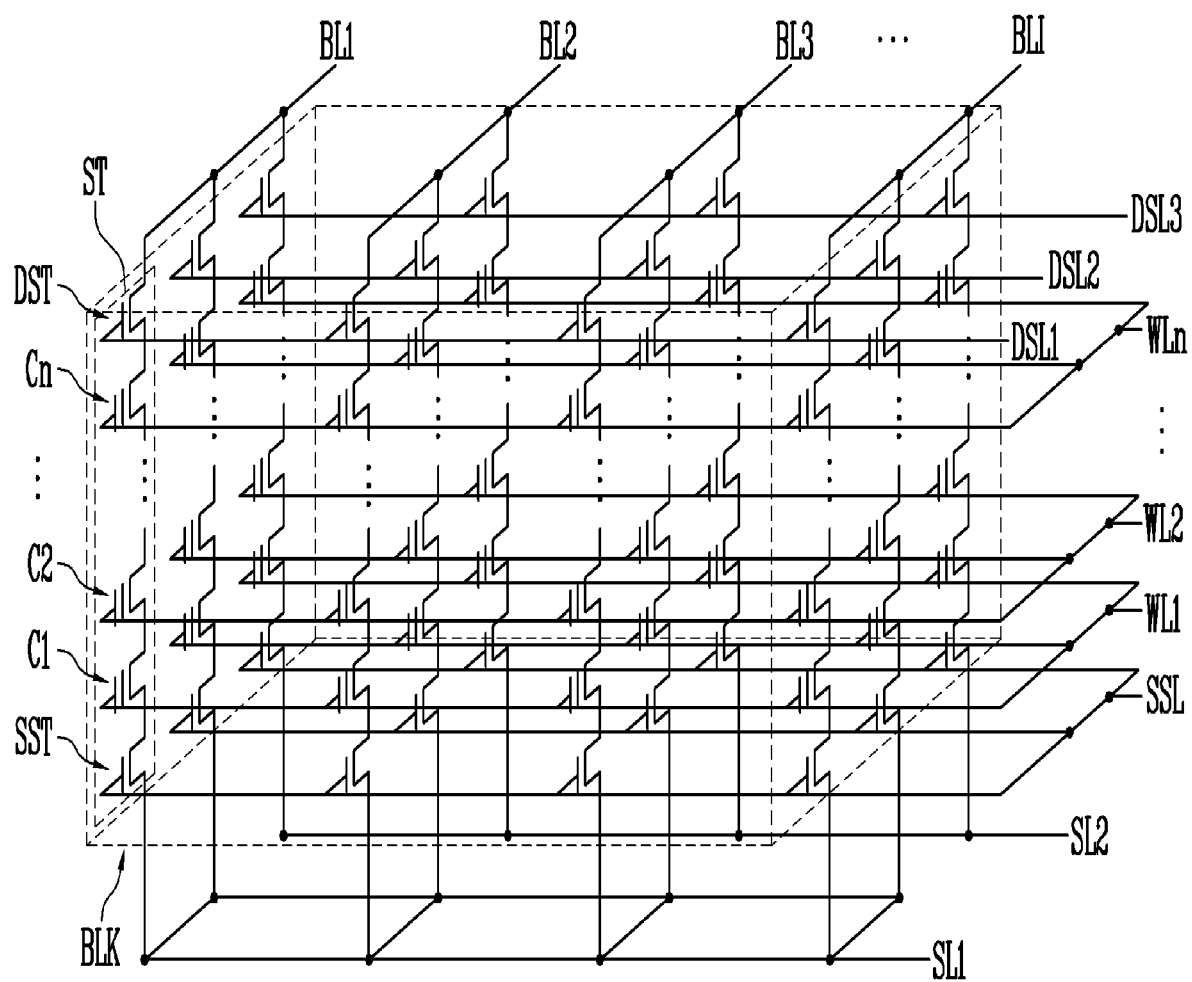
FIG. 7 is a circuit diagram illustrating an embodiment of a memory block.

FIG. 7 is a circuit diagram illustrating an embodiment of a memory block.

Referring to FIG. 7, a portion of a memory block BLK formed in a three-dimensional structure is illustrated. The memory block BLK may include a plurality of strings ST. The strings ST may include source select transistors SST, memory cells C1 to Cn (n is a positive integer), and drain select transistors DST, which are coupled between a first source line SL1 or a second source line SL2 and bit lines BL1 to BLI. Although a structure in which two source lines SL1 and SL2 are coupled to the strings ST is illustrated in the drawing, a plurality of source lines SL may be coupled to one memory block BLK.

Gates of source select transistors SST included in different strings ST may be coupled to a source select line SSL, gates of memory cells C1 to Cn included in the strings ST may be coupled to word lines WL1 to WLn, and gates of the drain select transistors DST included in the strings ST may be coupled to the select lines DSL1 to DSL3.

In FIG. 7, it is illustrated that one source select line SSL and one drain select line (any one of DSL1 to DSL3) are coupled to each of the strings ST, but the number of select lines may increase depending on memory devices. In addition, the strings ST may further include dummy cells (not illustrated) coupled to dummy lines (not illustrated). For example, the dummy cells may be coupled between some of the memory cells C1 to Cn, or be coupled between the memory cells C1 to Cn and the drain or source select transistors DST or SST.

Figure 8:
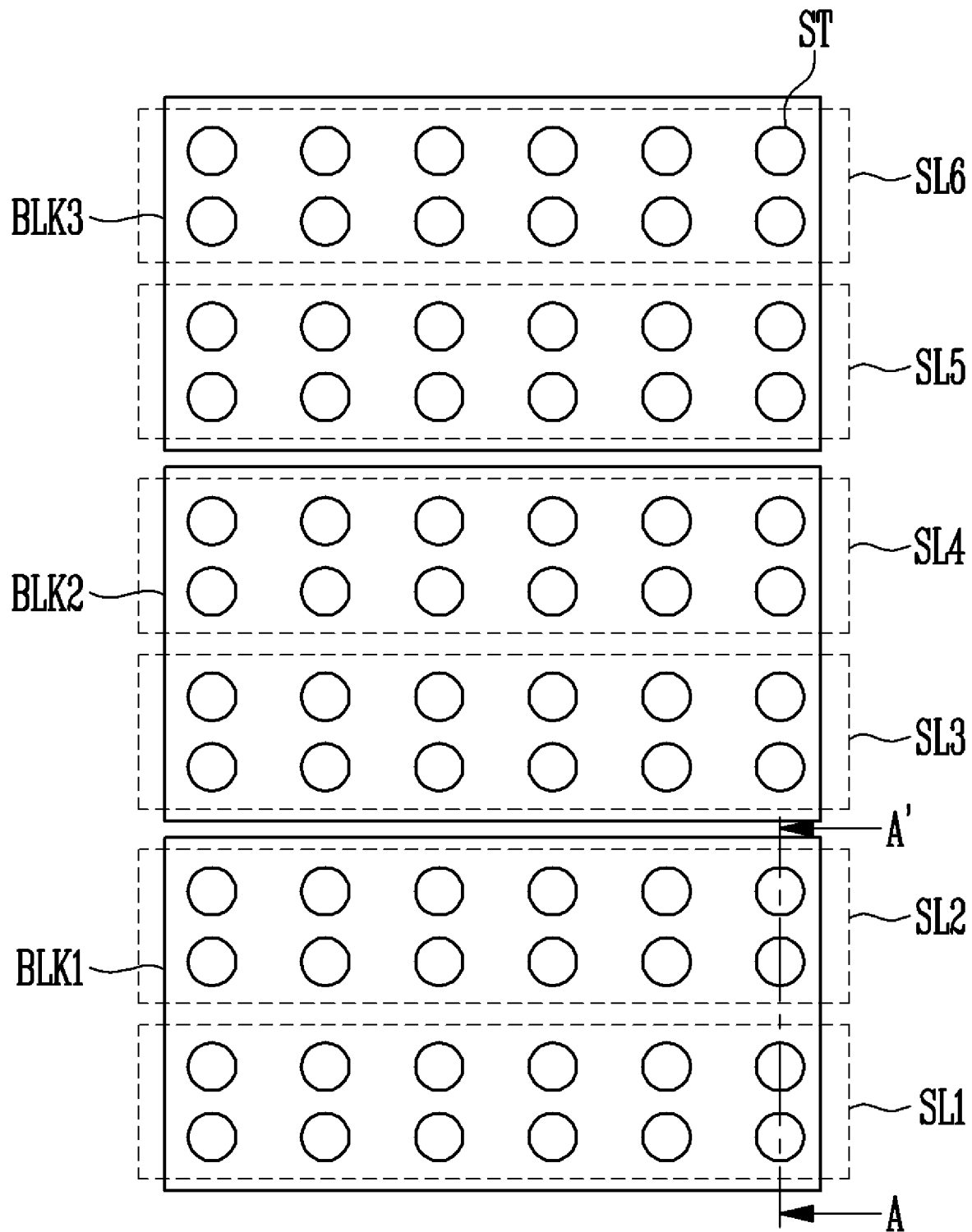
FIG. 8 is a plan view illustrating a configuration of source lines according to an embodiment of the present disclosure.

FIG. 8 is a plan view illustrating a configuration of source lines according to an embodiment of the present disclosure.

Referring to FIG. 8, a plurality of source lines SL1 to SL6 may be formed in memory blocks BLK1 to BLK3. For example, first and second source lines SL1 and SL2 may be formed in a first memory block BLK1, third and fourth source lines SL3 and SL4 may be formed in a second memory block BLK2, and fifth and sixth source lines SL5 and SL6 may be formed in a third memory block BLK3. A plurality of strings ST may be formed on each of the first to sixth source lines SL1 to SL6. As described above, if a plurality of source lines are formed in one memory block, a program, read, or erase operation of the strings divided in unit of source lines may be selectively performed. If an erase operation is described as an example, the erase operation may be selectively performed on only the strings ST coupled to the first source line SL1 of the first memory block BLK1. In this case, the strings ST coupled to the second source line SL2 of the first memory block BLK1 may be excluded from the erase operation.

A structure in which a plurality of source lines are formed in one memory block will be described with reference to sectional views taken along line A-A' illustrated in FIGS. 9 to 11.

Figure 9:
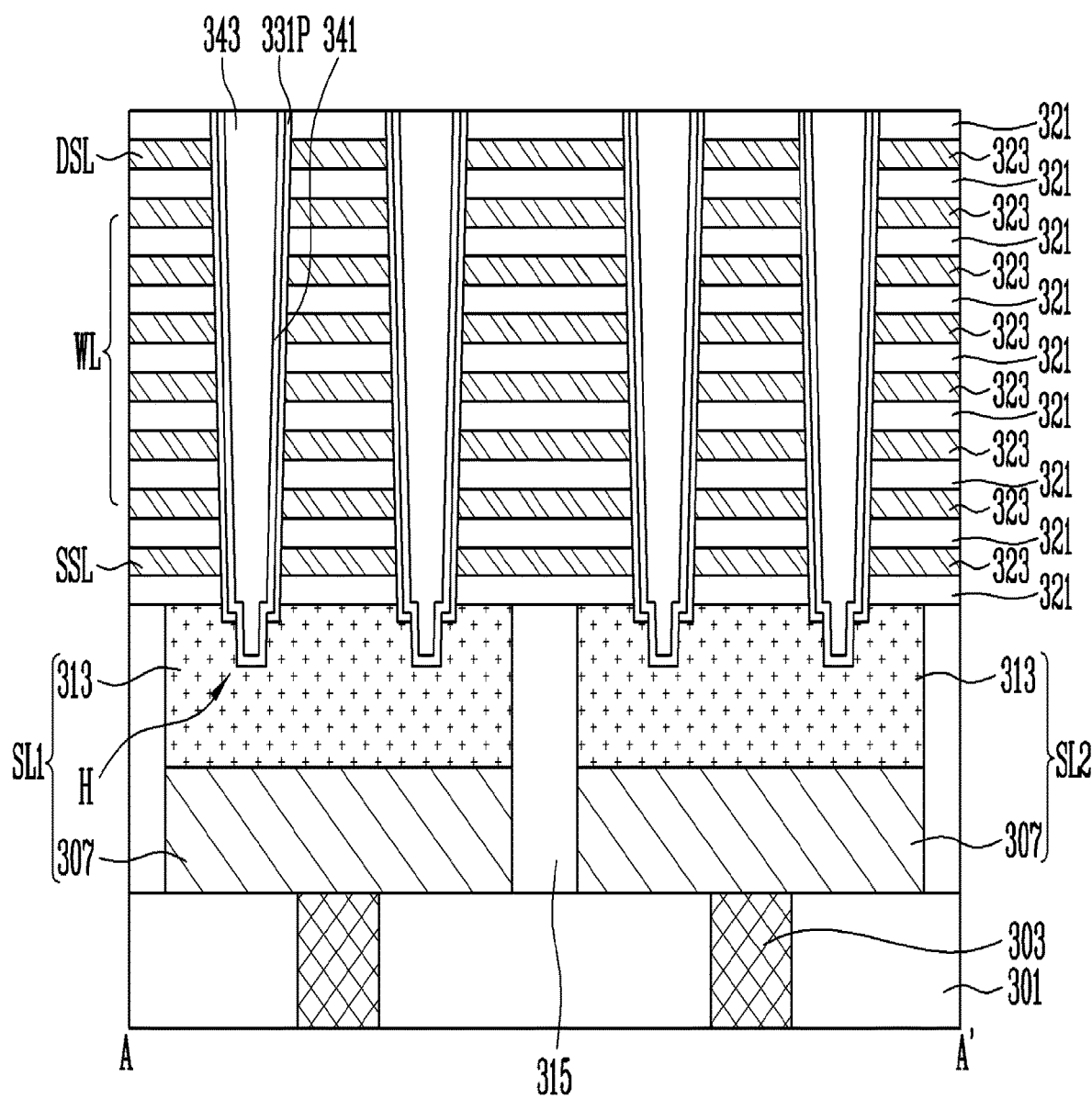
FIGS. 9 to 11 are sectional views illustrating memory blocks according to embodiments of the present disclosure.
Figure 10:
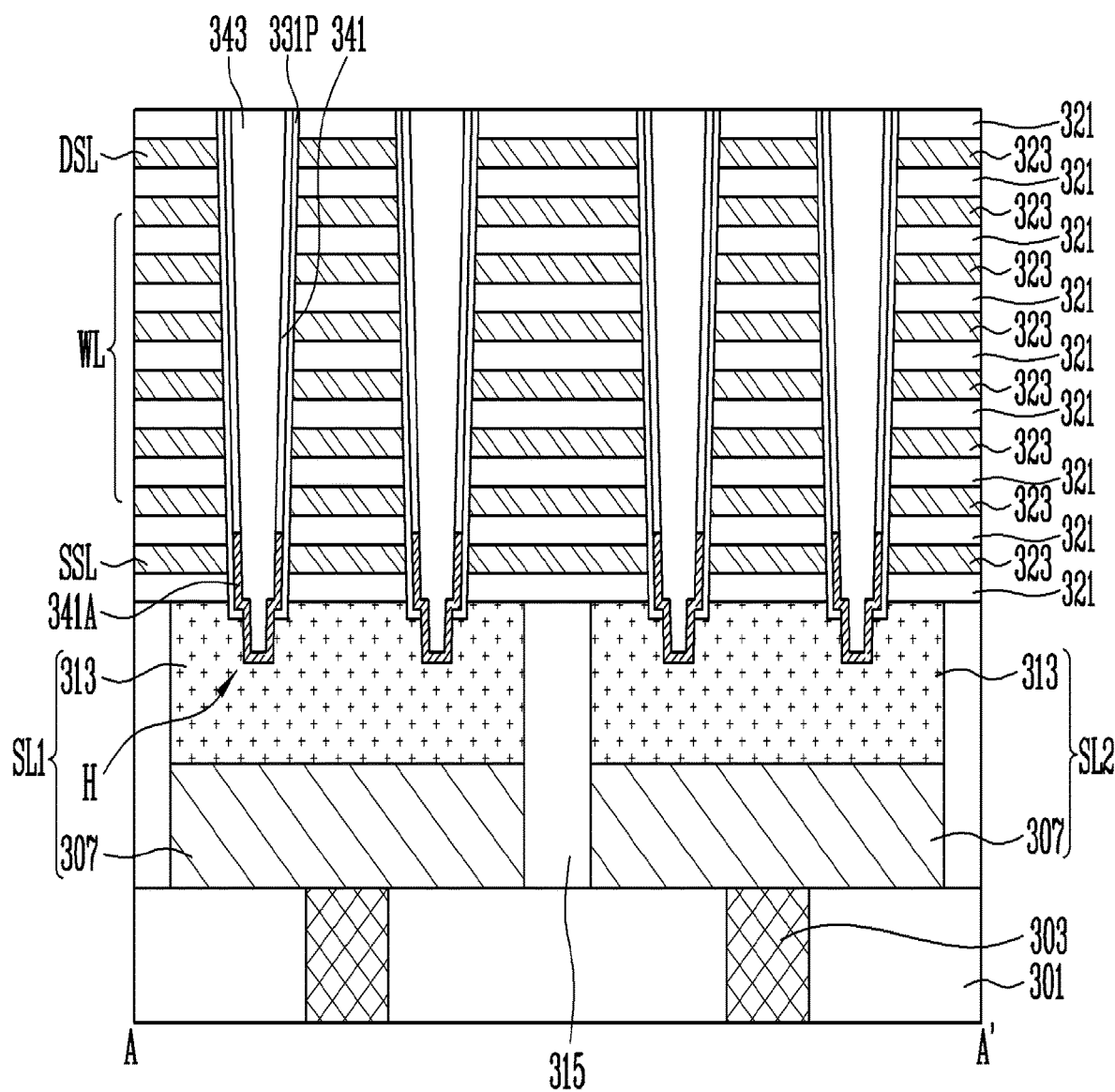
Figure 11:
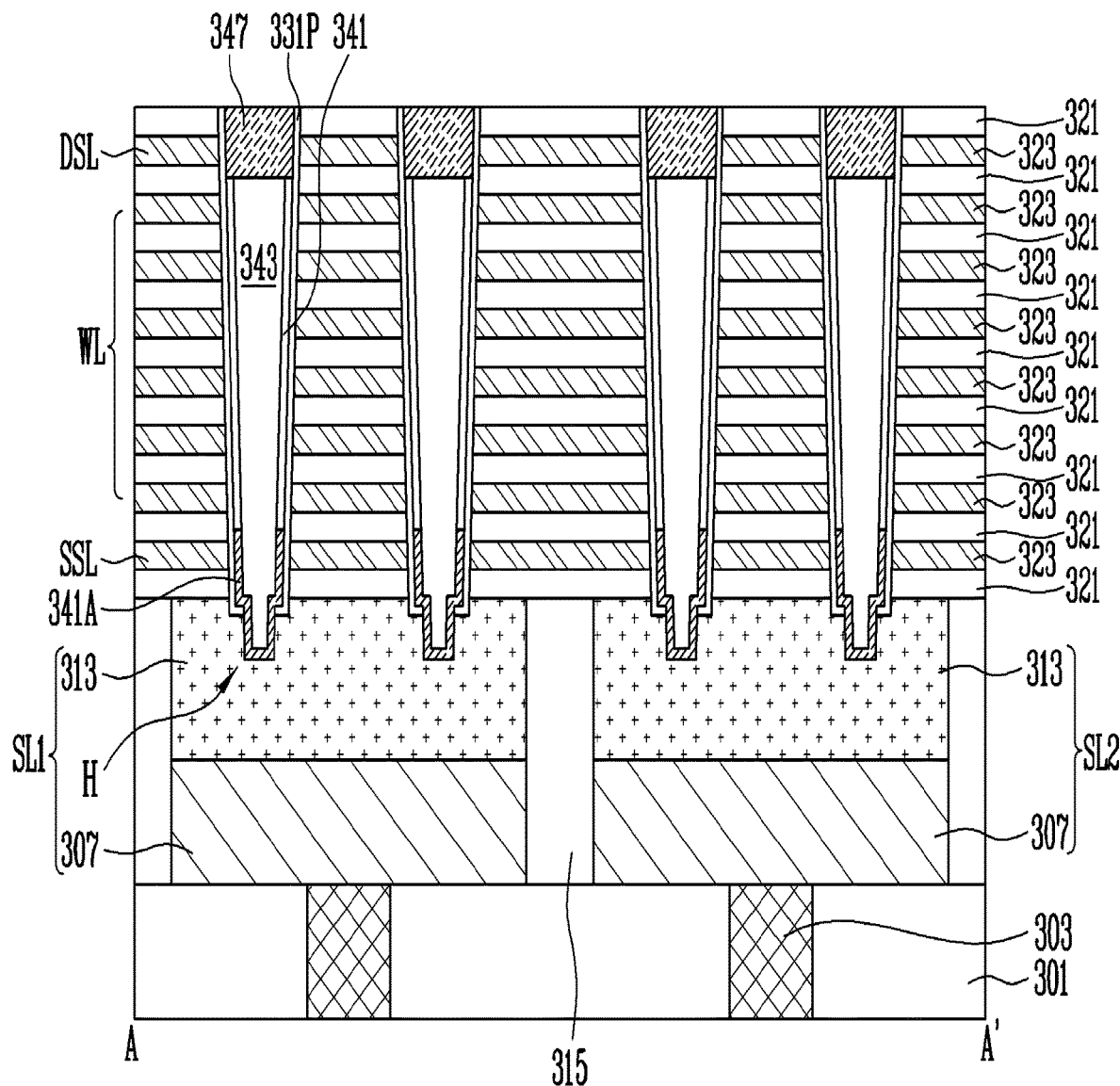

FIGS. 9 to 11 are sectional views illustrating memory blocks according to embodiments of the present disclosure.

Referring to FIG. 9, first and second source layers 307 and 313 may be stacked on the top of a lower structure including lower insulating layers 301 and source contact plugs 303. For example, the source contact plugs 303 may be formed vertically between the lower insulating layers 301. Although not illustrated in FIG. 9, some of peripheral circuits may be formed on the bottom of the lower structure. Therefore, the bottoms of the source contact plugs 303 may be in contact with lines included in the peripheral circuits.

The first source layers 307 may be formed on the lower insulating layers 301 and the source contact plugs 303, and the second source layers 313 may be formed on the first source layers 307. The first source layers 307 may be formed of a metal layer such as tungsten (W) to decrease the resistance of the first and second source lines SL1 and SL2. The second source layers 313 may be formed of a doped poly silicon layer including impurities.

The first and second source lines SL1 and SL2 may be divided by sub-insulating layers 315 that vertically penetrate the first and second source layers 307 and 313. For example, the sub-insulating layers 315 may be formed to be in contact with the lower insulating layers 301 between the source contact plugs 303. Therefore, the first and second source lines SL1 and SL2 that are in contact with one source contact plug 303 may form one source line. In an embodiment, for example the first source line SL1 in contact with one source contact plug 303 (left side of the sub-insulating layer) may form one source line. In an embodiment, for example, the second source line SL2 in contact with one source contact plug 303 (right side of the sub-insulating layer) may form one source line. In order to selectively apply voltages to the first and second source lines SL1 and SL2, the source contact plugs 303 that are respectively in contact with the first and second source lines SL1 and SL2 may be coupled to different voltage sources.

First and second material layers 321 and 323 may be alternately stacked on the second source layers 313 and the sub-insulating layers 315. For example, the first and second material layers 321 and 323 may be alternately stacked in such a manner that a first material layer 321 is formed on the second source layers 313 and the sub-insulating layers 315, a second material layer 323 is formed on the first material layer 321, and a first material layer 321 is formed on the second material layer 323. The first material layers 321 may be formed as insulating layers, and the second material layers 323 may be formed as conductive layers. The second material layers 323 may be used as source select lines SSL, word lines WL, and drain select lines DSL. For example, among the second material layers 323, material layers located at a lower end may be used as the source select lines SSL, material layers located at an upper end may be used as the drain select lines DSL, and material layers located between the source select lines SSL and the drain select lines DSL may be used as the word lines WL.

A plurality of channel holes H may be formed at upper portions of each of the second source layers 313. For example, a plurality of channel holes H may be formed at upper portions of the second source layer 313 for the first source line SL1, and a plurality of channel holes H may be formed at upper portions of the second source layer 313 for the second source line SL2. Memory layers 331P may be formed along inner surfaces of the channel holes H, and vertical channel layers 341 may be formed along inner surfaces of the memory layers 331P. Each of the memory layers 331P may include a tunnel insulating layer that is in contact with an inner sidewall of each of the channel holes H, a data storage layer that is in contact with an inner sidewall of the tunnel insulating layer, and a blocking insulating layer that is in contact with an inner sidewall of the data storage layer. The tunnel insulating layer may be formed of a silicon nitride layer in which electrons can be tunneled. The data storage layer may be formed of a phase change material, a ferroelectric material, or nanodots. The first blocking insulating layer may be formed of an insulating layer capable of blocking charges. The memory layers 331P may be opened at lower portions of the channel holes H such that portions of the second source layers 313 are exposed.

The vertical channel layers 341 may be formed to be filled in the channel holes H, or be formed in a cylindrical shape having an empty center. When the channel holes H are formed in a cylindrical shape, a central space of each of the channel holes H may be filled with a vertical insulating layer 343. The vertical channel layers 341 may be formed of a material including impurities. If portions of the second source layers 313 are exposed as lower portions of the memory layers 331P are opened, the vertical channel layers 341 may be formed to be in contact with the exposed portions of the memory layers 331P and the second source layers 313.

Therefore, in an erase operation, if an erase voltage is applied through the source contact plug 303 that is in contact with the first source line SL1, the erase voltage may be applied to the vertical channel layers 341 of the strings formed on the first source line SL1. At the same time, if a pass voltage is applied through the source contact plug 303 that is in contact with the second source line SL2, the pass voltage may be applied to the vertical channel layers 341 of the strings formed on the second source line SL2.

Referring to FIG. 10, unlike the embodiment of FIG. 9, a partial lower portion of the vertical channel layer 341 may be formed as a source junction 341A. The source junction 341A may be formed to decrease the resistance of the vertical channel layers 341 in a region in which the source select lines SSL are formed. For example, the source junction 341A may be formed to have an impurity concentration higher than that of the vertical channel layer 341. The other structure except the source junction 341A is similar to that of the embodiments of FIG. 9, and therefore, its detailed description will be omitted.

Referring to FIG. 11, unlike the embodiment of FIG. 10, a partial upper portion of the vertical channel 341 may be formed as a drain junction 347. The drain junction 347 may be formed to decrease the resistance of drain select transistors. The drain junction 347 may be formed in regions in which portions of the vertical channel layers 341 and the vertical insulating layers 343, which are formed at upper portions of the channel holes H, are removed. For example, the drain junction 347 may be formed by removing the vertical channel layers 341 and the vertical insulating layers 343, which correspond to the regions in which the drain select lines DSL are formed, and filling a doped poly silicon layer in the removed regions. The other structure except the drain junction 347 is similar to that of the embodiments of FIG. 10, and therefore, its description will be omitted.

Figure 12:
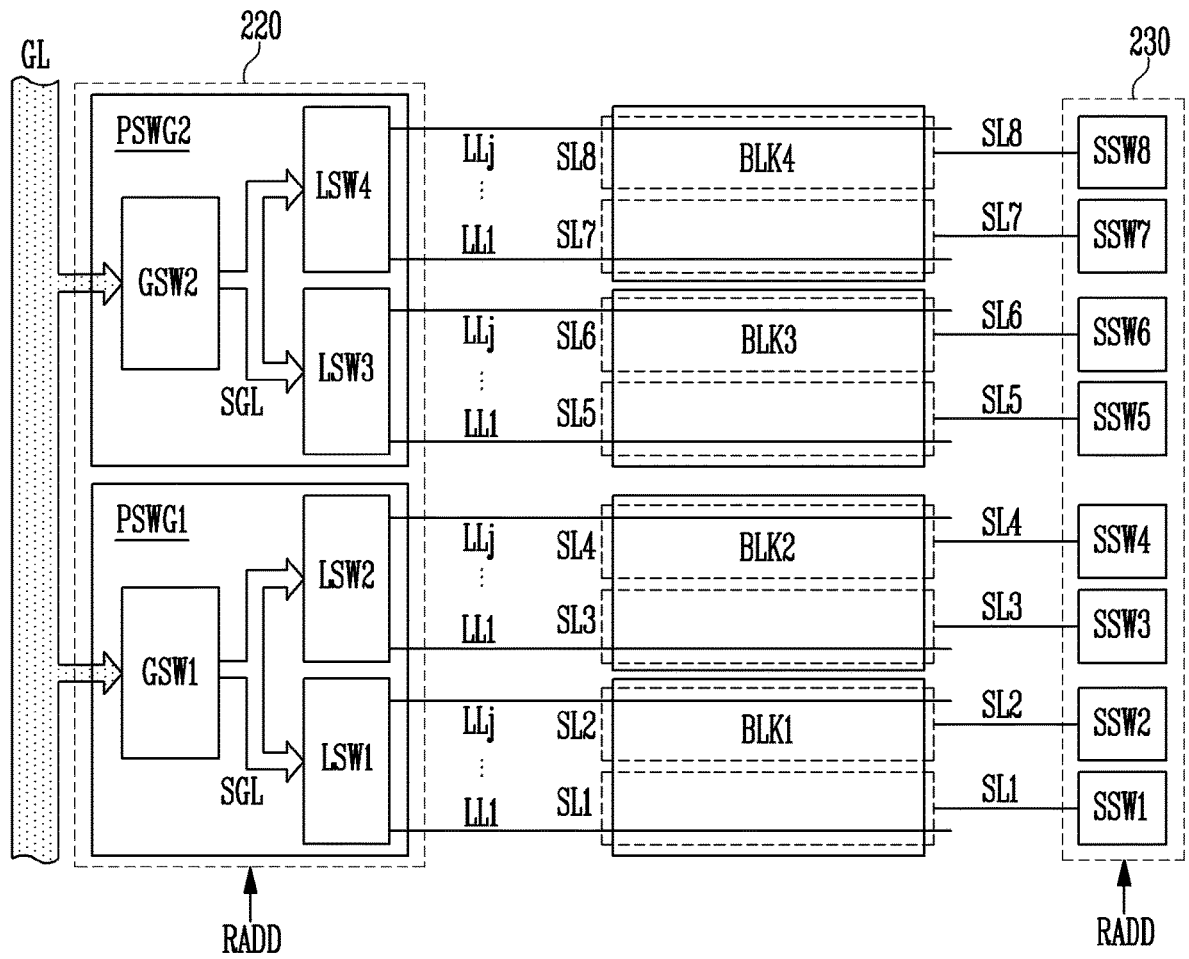
FIG. 12 is a diagram illustrating a row decoder and a source decoder according to an embodiment of the present disclosure.

FIG. 12 is a diagram illustrating a row decoder and a source decoder according to an embodiment of the present disclosure.

Referring to FIG. 12, each row decoder 220 and source decoder 230 may include a plurality of switch circuits to selectively drive a plurality of memory blocks BLK1 to BLK4 and source lines SL1 to SL8.

The row decoder 220 may include pass switch groups PSWG1 and PSWG2 for selectively transmitting operating voltages to a plurality of memory blocks. For example, a first pass switch group PSWG1 may be configured to control a switching operation of voltages applied to first and second memory blocks BLK1 and BLK2, and a second pass switch group PSWG2 may be configured to control a switching operation of voltages applied to third and fourth memory blocks BLK3 and BLK4. The first and second pass switch groups PSWG1 and PSWG2 are configured similarly to each other, and therefore, the first pass switch group PSWG1 is described as an example as follows.

The first pass switch group PSWG1 may include a first global switch circuit GSW1 and first and second local switch circuits LSW1 and LSW2.

The first global switch circuit GSW1 may be configured to selectively apply voltages, corresponding to a plurality of memory blocks. For example, the first global switch circuit GSW1 may include pass switches respectively corresponding to source select lines, word lines, and drain select lines, which are included in each memory block. The first global switch circuit GSW1 may transmit voltages applied to global lines GL to the first and second local switch circuits LSW1 and LSW2 through sub-global lines SGL in response to a row address RADD. The first global switch circuit GSW1 may be configured with high-voltage switches for applying a high turn-on voltage, and therefore, the area in which the high-voltage switches occupy in the memory device may be more as compared with other switches because the high-voltage switches used in the global switch circuits may be wider or have a greater width than other switches used in the configuration of other circuits within the memory device, for example but not limited to, local switch circuits. However, since one global switch circuit is configured to correspond to a plurality of memory blocks, the entire size of the memory device can be decreased as the number of global switch circuits is decreased.

The first local switch circuit LSW1 may transmit voltages applied through the sub-global lines SGL to local lines LL1 to LLj coupled to the first memory block BLK1 in response to the row address RADD. The first local switch circuit LSW1 may include pass switches respectively corresponding to source select lines, word lines, and drain select lines, which are included in each memory block. That is, memory cells corresponding to one source line may constitute one sub-memory block. Therefore, the first local switch circuit LSW1 may transmit a voltage to local lines coupled to a first sub-memory block included in the first memory block BLK1.

The second local switch circuit LSW2 may transmit voltages applied through the sub-global lines SGL to local lines LL1 to LLj coupled to the second memory block BLK2 in response to the row address RADD. The second local switch circuit LSW2 may include pass switches respectively corresponding to source select lines, word lines, and drain select lines, which are included in each memory block.

Here, the row address RADD applied to control the first global switch circuit GSW1, the first local switch circuit LSW1, and the second local switch circuit LSW2 may include different addresses. Therefore, when the first local switch circuit LSW1 is turned on, the second local switch circuit LSW2 may be turned off. That is, although the first and second local switch circuits LSW1 and LSW2 receive voltages equal to each other through the sub-global lines SGL, only the first local switch circuit LSW1 may transmit voltages to the first memory block BLK1, only the second local switch circuit LSW2 may transmit voltages to the second memory block BLK2, or the first and second local switch circuits LSW1 and LSW2 may simultaneously transmit voltages to the first and second memory blocks BLK1 and BLK2 or simultaneously interrupt the transmission of voltages, depending on the row address RADD. In addition, the first or second global switch circuit GSW1 or GSW2 may operate in response to the row address RADD, and therefore, the second global switch circuit GSW2 may be turned off when the first global switch circuit GSW1 is turned on.

The source decoder 230 may include first to eighth source switch circuits SSW1 to SSW8 that are respectively coupled to first to eighth source lines SL1 to SL8 and operate in response to the row address RADD. The row address RADD may also include different addresses. The first to eighth source switch circuits SSW1 to SSW8 may be selectively turned on or off in response to the row address RADD. For example, voltages generated from different voltage sources may be applied to the respective first to eighth source switch circuits SSW1 to SSW8, and the first to eighth source switch circuits SSW1 to SSW8 may selectively operate in response to the row address RADD.

Figure 13:
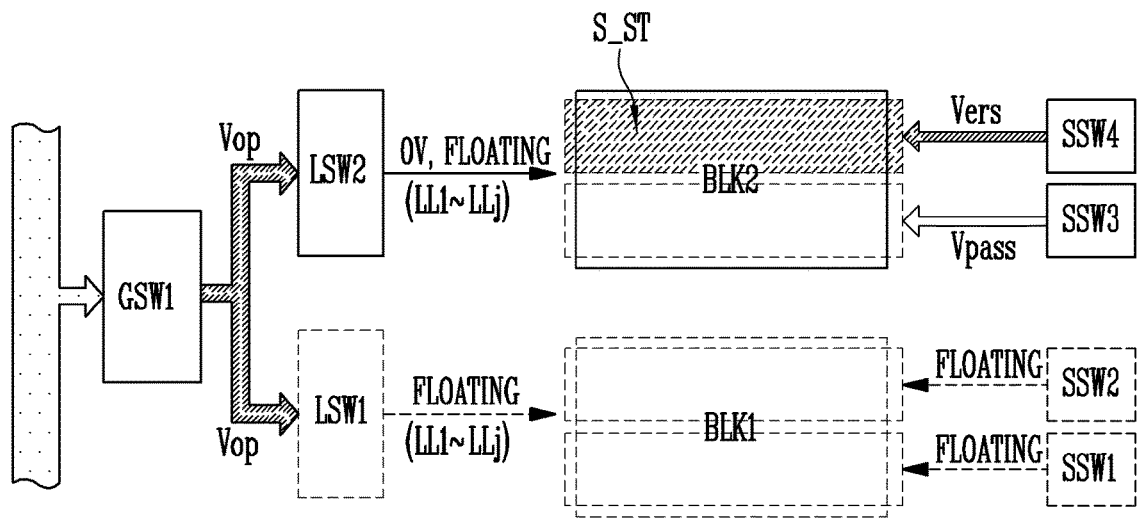
FIG. 13 is a diagram illustrating an operating method of the memory device according to an embodiment of the present disclosure.

FIG. 13 is a diagram illustrating an operating method of the memory device according to an embodiment of the present disclosure.

An erase operation of the memory device is described as an example with reference to FIGS. 13 and 12. In addition, it is assumed that an erase operation for the strings S_ST coupled to the fourth source line SL4 of the second memory block BLK2 is to be performed.

An erase voltage Vers may be applied to the fourth source switch circuit SSW4, and a pass voltage Vpass may be supplied to the third source switch circuit SSW3. If an erase operation is started, the fourth and third source switch circuits SSW3 and SSW4 may be turned on, so that a pass voltage Vpass is applied to the third source line SL3 and the erase voltage Vers is applied to the fourth source line SL4. In this case, both of the first and second source switch circuits SSW1 and SSW2 may be turned off. If the first and second source switch circuits SSW1 and SSW2 are turned off, the first and second source lines SL1 and SL2 coupled to the first memory block BLK1 may be floated.

As the first global switch circuit GSW1 is turned on, operating voltages Vop supplied to the global lines GL may be applied to the first and second local switch circuits LSW1 and LSW2. The operating voltages Vop may be voltages to be respectively applied to the source select lines, the word lines, and the drain select lines. For example, the operating voltages applied to the source and drain select lines may be 0V, and the source and drain select lines may be floated depending on a step of the erase operation. The pass voltage may be applied to word lines coupled to strings corresponding to the third source line SL3, or the word lines may be floated. The voltage of 0V may be applied to word lines coupled to strings corresponding to the selected fourth source line SL4.

In response to a row address RADD, the first local switch circuit LSW1 may be turned off, and the second local switch circuit LSW2 may be tuned on. Since the first local switch circuit LSW1 is turned off, all of the local lines LL1 to LLj coupled to the first memory block BLK1 may be floated.

That is, if strings corresponding to the fourth source line SL4 of the second memory block BLK2 are selected in the erase operation, the first global switch circuit GSW1, the second local switch circuit LSW2, and the fourth source switch circuit SSW4 may be turned on to operate, and the other unselected switch circuits LSW1 and SSW1 to SSW3 may be turned off or be selectively turned on.

In addition to the erase operation, even when a program or read operation is performed, strings included in a selected memory block may be selectively operated by controlling the global switch circuits, the local switch circuits, and the source switch circuits according to the selected memory block and a selected source line.

Figure 14:
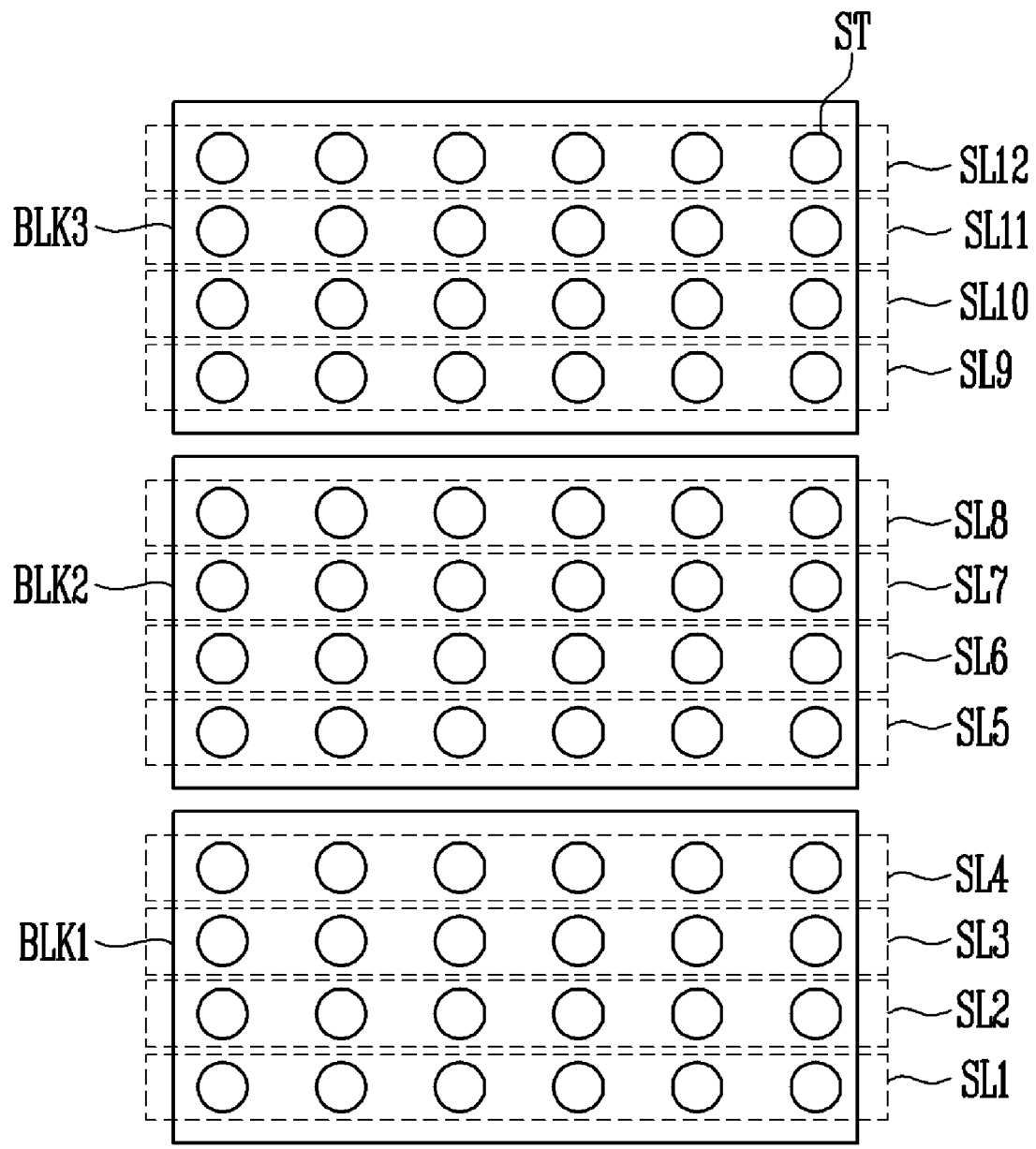
FIG. 14 is a plan view illustrating a configuration of source lines according to an embodiment of the present disclosure.

FIG. 14 is a plan view illustrating a configuration of source lines according to an embodiment of the present disclosure.

Referring to FIG. 14, although two source lines are formed in one memory block in the above-described embodiments, three or more source lines may be formed in one memory block as illustrated in the embodiments of FIG. 14. Numbers of source lines formed in the respective memory blocks may be equal to one another or be different from one another.

Figure 15:
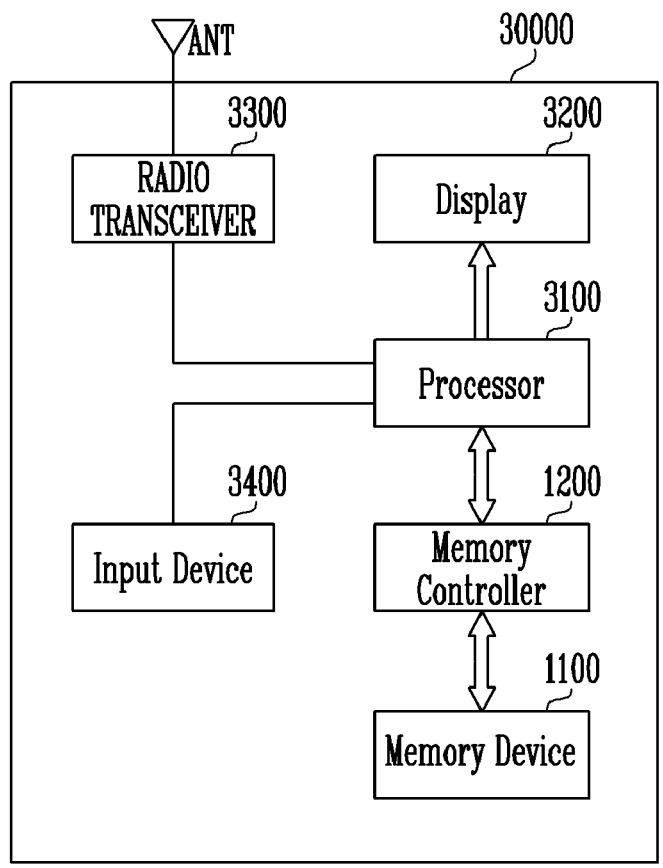
FIG. 15 is a diagram illustrating an embodiment of the memory system including the memory device illustrated in FIG. 2.

FIG. 15 is a diagram illustrating an embodiment of the memory system including the memory device illustrated in FIG. 2.

Referring to FIG. 15, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may convert a radio signal receive through the antenna ANT into a signal that can be processed by the processor 3100. Therefore, the processor 3100 may process a signal output from the radio transceiver 3300 and transmit the processed signal to the memory controller 1200 or the display 3200.

The memory controller 1200 may transmit the signal processed by the processor 3100 to the memory device 1100. In addition, the radio transceiver 3300 may convert the signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 16:
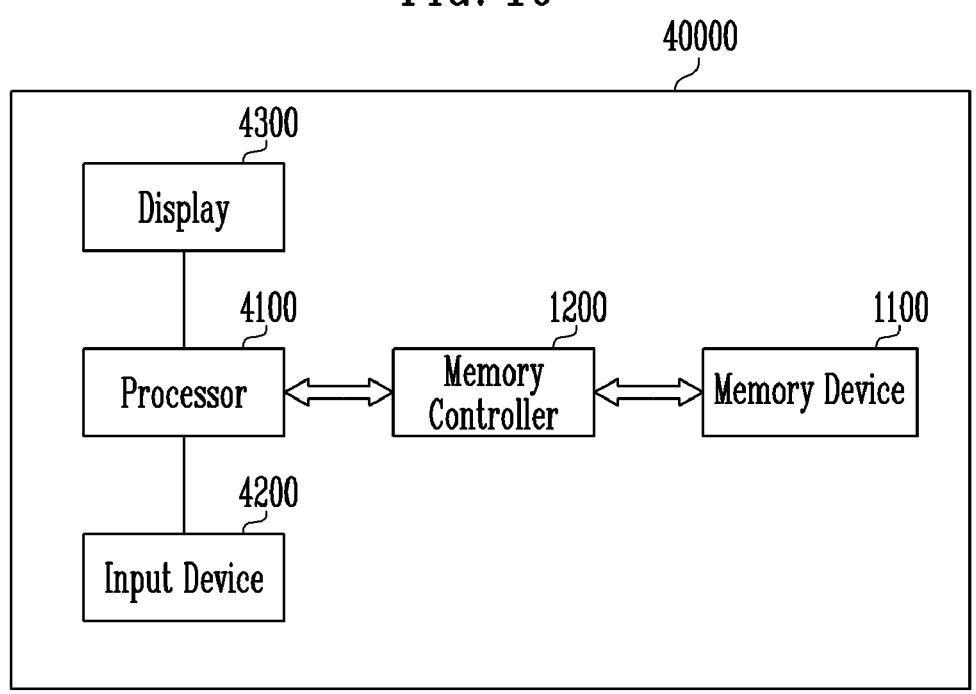
FIG. 16 is a diagram illustrating an embodiment of the memory system including the memory device illustrated in FIG. 2.

FIG. 16 is a diagram illustrating an embodiment of the memory system including the memory device illustrated in FIG. 2.

Referring to FIG. 16, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 17:
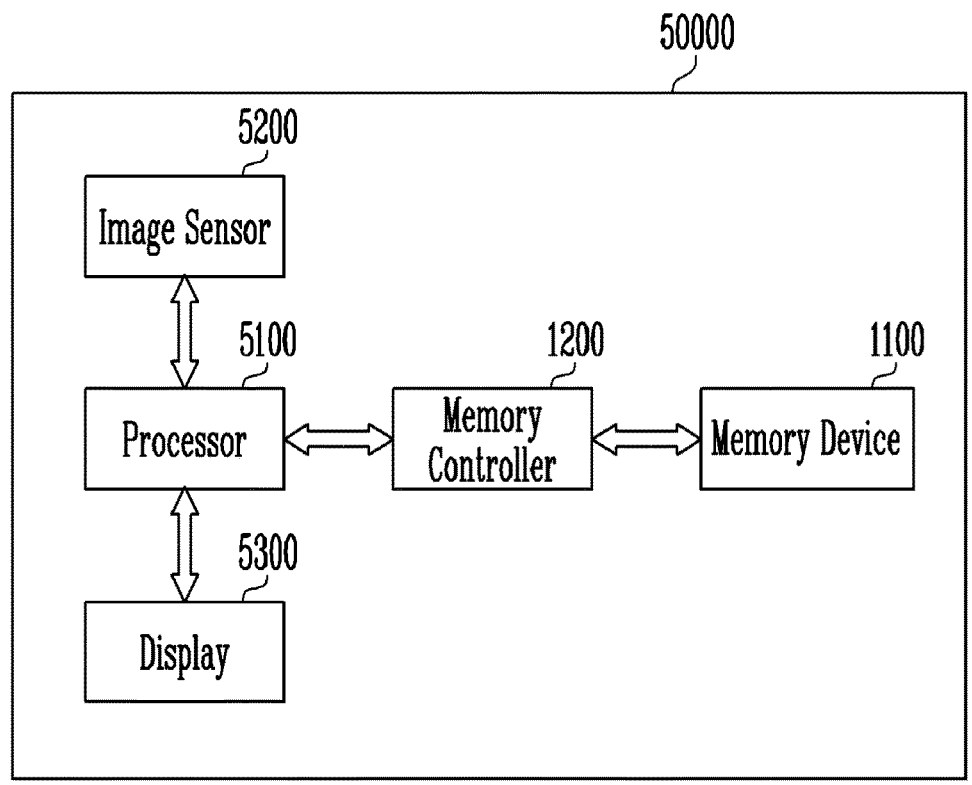
FIG. 17 is a diagram illustrating an embodiment of the memory system including the memory device illustrated in FIG. 2.

FIG. 17 is a diagram illustrating an embodiment of the memory system including the memory device illustrated in FIG. 2.

Referring to FIG. 17, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 18:
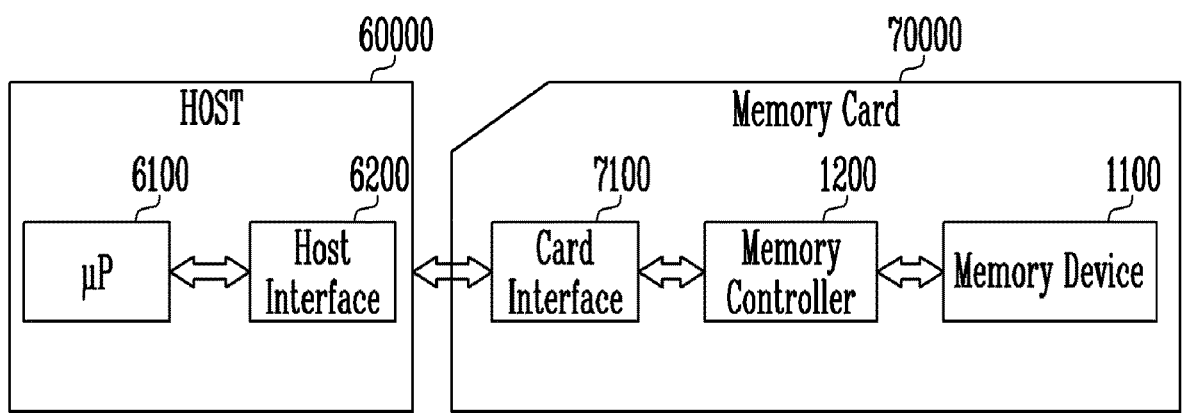
FIG. 18 is a diagram illustrating an embodiment of the memory system including the memory device illustrated in FIG. 2.

FIG. 18 is a diagram illustrating another embodiment of the memory system including the memory device shown in FIG. 2.

Referring to FIG. 18, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. Here, the card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor (μP) 6100.

According to the present disclosure, the size of the memory device can be reduced by decreasing the number of global switch circuits.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
    a plurality of source lines coupled to a memory block, wherein the source lines are separated from each other;
    a plurality of strings including vertical channel layers, select transistors and memory cells, wherein the vertical channel layers are vertically formed over the source lines, wherein the memory cells are stacked along the vertical channel layers, wherein the select transistors are formed between the memory cells and the source lines, and wherein gates of the select transistors are coupled to a select line;
    a source decoder configured to selectively apply voltages to a selected source line or unselected source lines among the source lines, wherein the source decoder includes source switch circuits, and the number of the source switch circuits corresponds to the number of the source lines, wherein each of the source switch circuits transmits a voltage supplied from different voltage sources to a source line in response to the row address; and
    a row decoder configured to selectively transmit voltages to local lines corresponding to the selected source line, wherein the source lines are separated from each other by a sub-insulating layer to allow the source switch circuits to selectively apply voltages to the source lines.

2. The memory device of claim 1, wherein the strings are coupled between bit lines and the source lines.

3. The memory device of claim 1, wherein the source switch circuits are coupled to respective source lines, and each selectively operates in response to a row address.

4. The memory device of claim 1, wherein each of the source switch circuits transmits the voltage supplied from the different voltage sources to the source line in response to the row address, or interrupts the transmission of the voltage.

5. The memory device of claim 1, wherein the row decoder includes:
    global switch circuits configured to transmit voltages supplied to global lines to sub-global lines in response to the row address; and
    local switch circuits configured to commonly receive voltages applied to the sub-global lines, and selectively transmit the voltages applied to the sub-global lines to local lines corresponding to the source lines.

6. The memory device of claim 5, wherein each of the global switch circuits is configured to correspond to the memory block.

7. The memory device of claim 5, wherein a number of the local switch circuits is equal to that of the source lines.

8. The memory device of claim 5, wherein each of the local switch circuits is configured to transmit voltages applied to the global lines to local lines corresponding to the source line or interrupt the transmission of the voltages.

9. A memory device comprising:
    a memory block including sub-memory blocks, wherein the sub-memory blocks include vertical channel layers, select transistors and memory cells which are stacked along the vertical channel layers, wherein the select transistors are formed between the memory cells and the source lines, wherein gates of the select transistors are coupled to a select line;
    a plurality of source lines coupled to the sub-memory blocks, respectively, wherein the source lines are separated from each other, wherein the vertical channel layers and the memory cells are vertically formed over the source lines;
    global switch circuits configured to transmit operating voltages to sub-global lines;
    local switch circuits configured to transmit the operating voltages applied to the sub-global lines to local lines of a selected sub-memory block among the sub-memory blocks, wherein local lines coupled to unselected sub-memory blocks are floated; and source switch circuits configured to transmit different voltages to the source lines coupled to the selected sub-memory block and unselected memory blocks, wherein a source line of a sub-memory block is separated from another source line of another sub-memory block by a sub-insulating layer to allow the source switch circuits to selectively apply different voltages to the sub-memory blocks through a respective source line.

10. The memory device of claim 9, further comprising:
global lines commonly coupled to the global switch circuits and configured to supply the operating voltages to the global switch circuits.

11. The memory device of claim 9, wherein, among the global switch circuits,
a selected global switch circuit transmits the operating voltages transmitted from global lines to the local switch circuits, and
unselected global switch circuits allow the global lines and the local switch circuits to be interrupted from each other.

12. The memory device of claim 11, wherein, among the local switch circuits corresponding to the selected global switch circuit,
a selected local switch circuit transmits the operating voltage transmitted from the selected global switch circuit to selected local lines coupled to the selected sub-memory block, and
unselected local switch circuits allow the selected global switch and the unselected sub-memory blocks to be interrupted from each other.

13. The memory device of claim 11, wherein, among the source switch circuits,
a selected source switch circuit transmits a voltage supplied from a voltage source to a selected source line coupled to the selected sub-memory block, and
unselected source switch circuits allow voltage sources and unselected source lines to be interrupted from each other.

14. The memory device of claim 9, wherein at least two of the source lines are coupled to the memory block.

15. A method for operating a memory device in which a plurality of sub-memory blocks corresponding to a plurality of source lines are included in a memory block, wherein the sub-memory blocks include vertical channel layers, select transistors and memory cells which are vertically formed over the source lines, wherein the select transistors are formed between the memory cells and the source lines, wherein gates of the select transistors are coupled to a select line, the method comprising:
applying a voltage to a source line coupled to a selected sub-memory block among the sub-memory blocks, and applying a different voltage to source lines coupled to unselected sub-memory blocks among the sub-memory blocks, wherein a source line of a sub-memory block is separated from another source line of another sub-memory block by a sub-insulating layer to allow the application of different voltages to the sub-memory blocks through a respective source line;
transmitting operating voltages to sub-global lines through a global switch circuit corresponding to the selected sub-memory block among a plurality of global switch circuits; and
transmitting the operating voltages applied to the sub-global lines to local lines coupled to the selected sub-memory block through a local switch circuit corresponding to the selected sub-memory block,
wherein the local lines include the select line.

16. The method of claim 15, wherein, when the voltage is applied to the source line coupled to the selected sub-memory block, the source lines coupled to the unselected sub-memory blocks are floated.

17. The method of claim 15, wherein, when the operating voltages are transmitted to the local lines coupled to the sub-memory block, local lines coupled to the other unselected sub-memory blocks included in the same memory block as the selected sub-memory block are floated.

* * * * *